United States Patent
Sekizaki et al.

(10) Patent No.: US 8,446,123 B2
(45) Date of Patent: *May 21, 2013

(54) STATE MONITORING UNIT FOR MONITORING A STATE OF AN ASSEMBLED BATTERY

(75) Inventors: Masashi Sekizaki, Makinohara (JP); Satoshi Ishikawa, Makinohara (JP); Kimihiro Matsuura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 344 days.

This patent is subject to a terminal disclaimer.

(21) Appl. No.: 12/861,885

(22) Filed: Aug. 24, 2010

(65) Prior Publication Data

US 2011/0050237 A1 Mar. 3, 2011

(30) Foreign Application Priority Data

Aug. 25, 2009 (JP) .................................. 2009-194264

(51) Int. Cl.
*H01M 10/46* (2006.01)

(52) U.S. Cl.
USPC ........................................................ 320/107

(58) Field of Classification Search
USPC .................. 320/107, 112, 116, 128, 132, 133, 320/155; 324/426, 430, 433
See application file for complete search history.

(56) References Cited

U.S. PATENT DOCUMENTS

| 2006/0017444 A1* | 1/2006 | Fechalos et al. | 324/433 |
| 2008/0180106 A1* | 7/2008 | Gorbold | 324/434 |
| 2011/0050236 A1* | 3/2011 | Sekizaki et al. | 324/426 |

FOREIGN PATENT DOCUMENTS

JP 2009-050085 A 3/2009

* cited by examiner

*Primary Examiner* — Edward Tso
(74) *Attorney, Agent, or Firm* — Sughrue Mion, PLLC

(57) ABSTRACT

A state monitoring unit monitors a state of an assembled battery in which a plurality of unit cells are connected in series. The state monitoring unit includes: a plurality of voltage monitoring devices provided in a high voltage side and a controller provided in a low voltage side electrically isolated with the high voltage side. The controller transmits a common voltage measurement command to the respective voltage monitoring devices connected via a communication channel in a daisy-chain scheme. The controller includes a storage for storing latency time determined based on a required time for each of the voltage monitoring devices elapsing from transmission of the common voltage measurement command with respect to the communication channel to voltage measurement of the unit cells, and measures charging/discharging current of the assembled battery when the latency time has elapsed from the transmission of the common voltage measurement command with respect to the communication channel.

4 Claims, 8 Drawing Sheets

STATE MONITORING UNIT FOR MONITORING A STATE OF AN ASSEMBLED BATTERY

BACKGROUND OF THE INVENTION

1. Technical Field

The present invention relates to a unit for monitoring the state of an assembled battery which includes a plurality of unit cells connected in series in order to output a desired voltage.

2. Background Art

For example, a hybrid vehicle includes an assembled battery which acts as a motor driving power source. Such an assembled battery obtains a high voltage by connecting, in series, a plurality of unit cells of a secondary battery (storage battery) such as, for example, a nickel-hydrogen battery, a lithium battery or the like.

For such an assembled battery, there is a need to monitor a charging state of each unit cell in order to prevent each unit cell from being over-discharged or over-charged. The monitoring of the charging state of each unit cell requires the measurement of a voltage of each unit cell and a charging/discharging current of the assembled battery. By measuring these parameters, it may be determined whether the assembled battery is in a charging condition or a discharging condition, thus detecting a charging condition of each unit cell, and further, a deterioration condition of each unit cell may be determined by calculating a resistance value of each unit cell.

Typically, a control system for an assembled battery includes a plurality of high voltage side controllers connected respectively to charging/discharging circuits of the assembled battery and a low voltage side controller electrically isolated from the plurality of high voltage side controllers. Each of the plurality of high voltage side controllers is provided to correspond to each unit cell and measures a voltage of each unit cell. The measured voltage of each unit cell is output to the low voltage side controller via a non-contact connector such as a photo coupler or the like. The low voltage side controller measures a charging/discharging current of each of the assembled battery by means of a non-contact type current sensor. The measured charging/discharging current of each of the assembled battery, along with the voltage of each unit cell input from each of the plurality of high voltage side controllers, is output, either as it is or after being subjected to a process, to a high level computer equipped within the vehicle.

In this manner, when the high voltage side controllers measure voltages of unit cells and the low voltage side controller measures the charging/discharging current of the assembled battery, there is a need to synchronize both measurement timings. One reason for this may include a frequent alternation between vehicle acceleration and deceleration in the hybrid vehicle.

Such an alternation between vehicle acceleration and deceleration causes an alternation between powering conditions and regenerative conditions of a motor generator and hence an alternation between the charging condition and discharging condition of the assembled battery. Accordingly, if the measurement timing of voltage of the unit cells is not in synchronization with the measurement timing of charging/discharging current of the assembled battery, a voltage of the unit cell measured during discharging of the assembled battery may be actually mistaken as a voltage during charging from a result of measurement of the charging/discharging current of the assembled battery, which may result in misrecognition of charging conditions of the batteries. In addition, such timing asynchronization may result in incorrect determination of resistance of the unit cell from the voltage of the unit cell and the charging/discharging current of the assembled battery.

So, if a measurement voltage of each unit cell is individually input from each of the high voltage side controllers to the low voltage side controller, the above-mentioned synchronization can be obtained by the low voltage side controller measuring the charging/discharging current of the assembled battery in synchronization with an input timing of the measurement voltage of the unit cell (for example see JP-A-2009-50085).

The above-mentioned synchronization method is based upon the premise that the low voltage side controller can determine from which of the high voltage side controllers the measurement voltage of the unit cell is input. For this reason, the low voltage side controller is required to output a voltage measurement command to each of the high voltage side controllers individually and determine from which of the high voltage side controllers the measurement voltage of the unit cell in response to this voltage measurement command is input.

Accordingly, if the low voltage side controller outputs a common voltage measurement command to all of the high voltage side controllers and, in response to this command, each of the high voltage side controllers outputs a measurement voltage of a corresponding unit cell to the low voltage side controller, it becomes difficult to synchronize the measurement timing of the charging/discharging current of the assembled battery with the measurement timing of the voltage of each unit cell. This is because the low voltage side controller can not determine from which of the high voltage side controllers the measurement voltage of the unit cell is input to the low voltage side controller, based on the fact that the voltage measurement command is common to all of the high voltage side controllers.

SUMMARY OF THE INVENTION

In consideration of the above circumstances, it is an object of the present invention to provide a state monitoring unit for an assembled battery, which is capable of synchronizing a measurement timing of a voltage of each of a plurality of unit cells connected in series with a measurement timing of a charging/discharging current of the assembled battery even when all of high voltage side controllers corresponding respectively to the plurality of unit cells output measurement voltages of the corresponding unit cells to a low voltage side controller in response to a common voltage measurement command from the low voltage side controller.

A state monitoring unit according to an aspect of the present invention monitors a state of an assembled battery in which a plurality of unit cells are connected in series. The state monitoring unit includes: a plurality of voltage monitoring devices provided in a high voltage side and a controller provided in a low voltage side electrically isolated with the high voltage side. The controller transmits a voltage measurement command to the respective voltage monitoring devices connected via a communication channel in a daisy-chain scheme. The controller includes a storage for storing latency time determined based on a required time for each of the voltage monitoring devices elapsing from transmission of the voltage measurement command with respect to the communication channel to voltage measurement of the unit cells, and measures charging/discharging current of the assembled battery when the latency time has elapsed from the transmission of the voltage measurement command with respect to the communication channel.

According to the state monitoring unit of the assembled battery of the present invention, even when each voltage monitoring device measures the voltage of the unit cells according to a common voltage measurement command, a timing of voltage measurement of each unit cell can be synchronized with a timing of charging/discharging current measurement of the assembled battery.

DETAILED DESCRIPTION OF THE EXEMPLARY EMBODIMENTS

According to an aspect of the present invention, there is provided a state monitoring unit for monitoring a state of an assembled battery in which a plurality of unit cells are connected in series, the state monitoring unit comprising: a high voltage side including a plurality of voltage monitoring devices, each device corresponding to respective unit cells among the plurality of unit cells; and a low voltage side electrically isolated with the high voltage side, and including a controller which controls the respective voltage monitoring devices, wherein a common voltage measurement command for instructing a voltage measurement of the unit cells is transmitted from the controller to the respective voltage monitoring devices connected via a communication channel in a daisy-chain scheme, the controller comprises a storage for storing latency time determined based on a required time for each of the voltage monitoring devices elapsing from transmission of the common voltage measurement command with respect to the communication channel to voltage measurement of the unit cells performed by the each of the voltage monitoring devices which has received the common voltage measurement command, and the controller measures charging/discharging current of the assembled battery when the latency time has elapsed from the transmission of the common voltage measurement command with respect to the communication channel.

According to the state monitoring unit as mentioned above, the controller transmits the common voltage measurement command to respective voltage monitoring devices connected in a daisy chain scheme, and then measures the charging/discharging current of the assembled battery when latency time elapses. The latency is determined based on required time from the transmission of the voltage measurement command to the voltage measurement of unit cells in each voltage monitoring device.

Accordingly, a timing when the controller measures the charging/discharging current of the assembled battery becomes a timing having relation to a timing when each voltage monitoring device measures the voltage of the unit cells. For this reason, even when each voltage monitoring device measures the voltage of the unit cells according to a common voltage measurement command, a timing of voltage measurement of each unit cell can be synchronized with a timing of charging/discharging current measurement of the assembled battery.

The state monitoring unit may be configured in that each of the voltage monitoring devices includes therein a measurement timing detection circuit, output of which is changed when performing the voltage measurement of the corresponding unit cells, and the required time is a time elapsing from the transmission of the voltage measurement command with respect to the communication channel by the controller to change in output of the measurement timing detection circuit.

According to the state monitoring unit as mentioned above, a timing when the voltage of the unit cells to which each voltage monitoring device corresponds is measured can be recognized by a change in output of the internal measurement timing detection circuit of each voltage monitoring device. Accordingly, by reliably detecting the required time from the output of the voltage measurement command by the controller to the measurement of voltage of the unit cells by the voltage monitoring device, the latency to be stored in the storage of the controller can be set as proper time.

The state monitoring unit may be configured in that the maximum time difference of the required times for the voltage monitoring devices falls within the maximum time difference allowed between a timing of the voltage measurement and a timing of the charging/discharging current measurement, and the latency time is set to an average value of the required times for the voltage monitoring devices or an intermediate value closest to the average value.

According to the state monitoring unit as mentioned above, a time difference between a timing when the charging/discharging current of the assembled battery after the latency elapses from the transmission of the voltage measurement command is measured and a timing when the voltage of the unit cells to which each voltage monitoring device corresponds is measured falls within the maximum time difference allowed between both timings, even when the time difference is the maximum. Accordingly, it is possible to obtain synchronization to a required level between the timing of voltage measurement of each unit cell and the timing of charging/discharging current measurement of the assembled battery.

The state monitoring unit may be configured in that the required time for each of the voltage monitoring devices is stored in the storage as the latency time, and the controller measures respective charging/discharging currents of the assembled battery when the required time for each of the voltage monitoring devices as the latency time has elapsed from the transmission of the voltage measurement command with respect to the communication channel.

According to the state monitoring unit as mentioned above, whenever a timing when the voltage of the unit cells to which each voltage monitoring device corresponds is measured arrives, a point of time when the latency elapses from the transmission of the voltage measurement command arrives, and the charging/discharging current of the assembled battery can be measured for every point of time. Accordingly, it is possible to synchronize the timing of voltage measurement of each unit cell with the timing of charging/discharging current measurement of the assembled battery.

Hereinafter, a state monitoring unit for an assembled battery according to embodiments of the present invention will be described with reference to the drawings.

Embodiment

Figure 1:
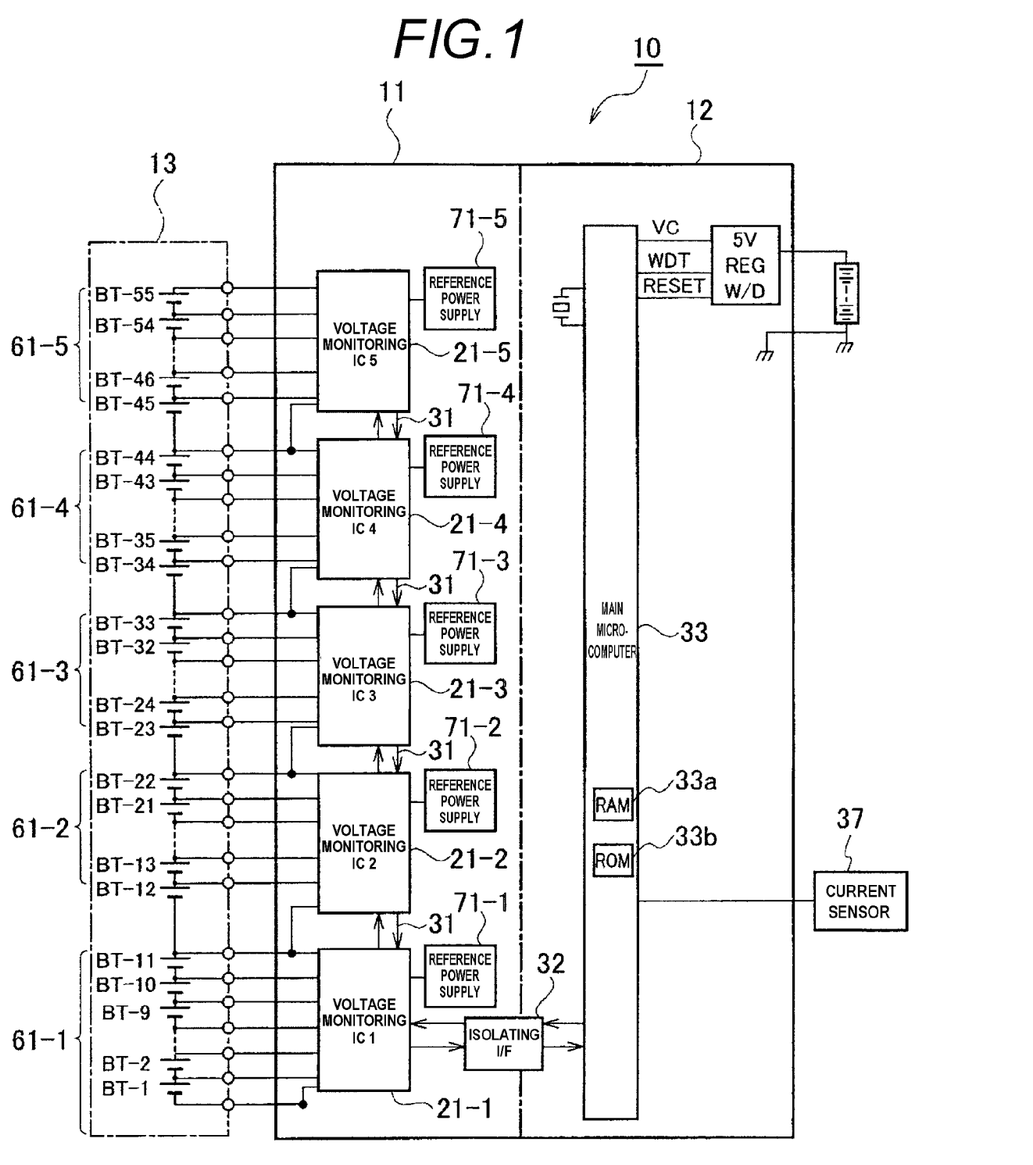
FIG. 1 is a block diagram showing a general electrical configuration of a state monitoring unit for an assembled battery according to an embodiment of the present invention.

FIG. 1 is a block diagram showing a general electrical configuration of a state monitoring unit for an assembled battery according to an embodiment of the present invention. In FIG. 1, a state monitoring unit 10 for an assembled battery (hereinafter abbreviated as "state monitoring unit"), serves to control a voltage of a secondary battery 13 (corresponding to an assembled battery) having a plurality of unit cells connected in series, such as a lithium battery or the like. The secondary battery 13 is used as a power supply of a motor M for driving a vehicle (not shown). In this embodiment, the secondary battery 13 is constituted by connecting 55 unit cells BT-1 to BT-55 in series. The secondary battery 13 is used as a high voltage battery for driving a motor used for, for example, a hybrid vehicle or an electric vehicle.

As shown in FIG. 1, the state monitoring unit 10 according to this embodiment is divided into a high voltage side device 11 (corresponding to a high voltage side) and a low voltage side device 12 (corresponding to a low voltage side) with an isolating interface 32 interposed therebetween.

The high voltage side device 11 includes five voltage monitoring ICs, i.e., first to fifth voltage monitoring ICs 21-1 to 21-5 (corresponding to a voltage monitoring device). The first voltage monitoring IC 21-1 measures output voltages of 11 unit cells BT1 to BT11 designated as a first block 61-1. Similarly, the second voltage monitoring IC 21-2 measures output voltages of 11 unit cells BT12 to BT22 designated as a second block 61-2, the third voltage monitoring IC 21-3 measures output voltages of 11 unit cells BT23 to BT33 designated as a third block 61-3, the fourth voltage monitoring IC 21-4 measures output voltages of 11 unit cells BT34 to BT44 designated as a fourth block 61-4, and the fifth voltage monitoring IC 21-5 measures output voltages of 11 unit cells BT45 to BT55 designated as a fifth block 61-5.

In addition, each voltage monitoring IC 21-1 to 21-5 has a respective A/D converter 26 (see FIG. 2) which uses a reference voltage output from each reference power supply 71-1 to 71-5 for A/D conversion to convert a voltage signal measured for each unit cell provided in each block (the first to fifth blocks) into a digital voltage signal.

Additionally, the second to fifth voltage monitoring ICs 21-2 to 21-5 are connected to the first voltage monitoring IC 21-1 via a communication line 31 (corresponding to a communication channel), and the first voltage monitoring IC 21-1 is connected to a main microcomputer 33 (corresponding to a main controller) provided in the low voltage side device 12 via the isolating interface 32. That is, the main microcomputer 33 and each voltage monitoring IC 21-1 to 21-5 are connected via the isolating interface 32 in daisy chain communication by the communication line 31. In addition, a terminator (termination resistance, not shown) is connected to the fifth voltage monitoring IC 21-5 (more specifically, a communication I/F 35a which will be described later) located in the end of the communication line 31.

Figure 2:
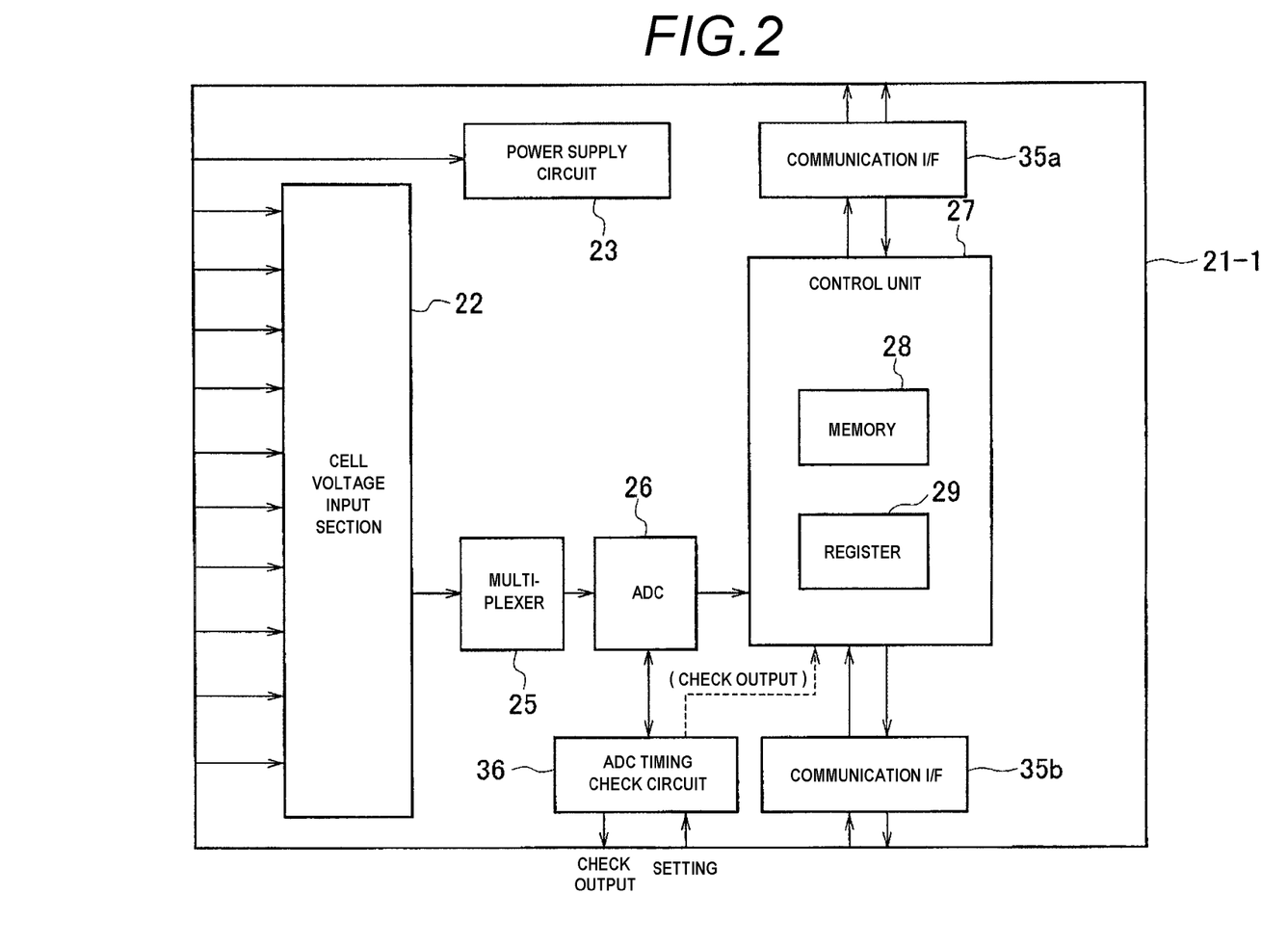
FIG. 2 is a block diagram showing a detailed configuration of a voltage monitoring device of FIG. 1.

FIG. 2 is a block diagram showing an internal configuration of the first voltage monitoring IC 21-1. Hereinafter, the detailed configuration of the first voltage monitoring IC 21-1 will be described with reference to FIG. 2. The second to fifth voltage monitoring ICs 21-2 to 21-5 have the same configuration as that of the first voltage monitoring IC 21-1, and therefore, detailed explanation thereof will be omitted.

As shown in FIG. 2, the first voltage monitoring IC 21-1 includes a power supply circuit 23 which receives power output from the unit cells BT1 to BT11 and generates a predetermined voltage, a cell voltage input section 22 which is connected to the unit cells BT1 to BT11 provided in the block 61-1 and detects output voltages of the unit cells, a multiplexer 25 which converts voltage signals of the unit cells BT1 to BT11 output from the cell voltage input section 22 into a time series of signals, and an A/D converter 26 which converts the voltage signals of the unit cells BT1 to BT11 output from the multiplexer 25 into digital signals. The A/D converter 26 converts an analog signal into a digital signal using a reference voltage output from the reference power supply 71-1.

Additionally, the first voltage monitoring IC 21-1 has a control unit 27 and two communication I/Fs 35a and 35b.

The control unit 27 may be configured by a one-chip microcomputer having a memory 28 and a register 29 for data storage and collectively controls the first voltage monitoring IC 21-1. In addition, upon receiving the output voltages of the unit cells BT1 to BT11 from the A/D converter 26, the control unit 27 stores the received voltages of the unit cells BT1 to BT11 in the memory 28 and performs a process of transmitting the stored output voltages of the unit cells BT1 to BT11 to the main microcomputer 33 shown in FIG. 1 via the communication I/Fs 35a and 35b.

Additionally, the first voltage monitoring IC 21-1 has an ADC timing check circuit 36 (corresponding to a measurement timing detection circuit). The ADC timing check circuit 36 can set ON/OFF of a monitoring mode to monitor a timing of the A/D conversion by the A/D converter 26. This setting may be performed by a setting signal from the outside or by manipulation of an internal dip switch (not shown).

The ADC timing check circuit 36 has an output port of a check signal by which a high/low level of an output signal obtained when the A/D converter 26 performs the A/D conversion is inverted when the monitoring mode is set to be ON. The check signal (check output) output from the output port may be put into an external terminal (not shown) connected to the ADC timing check circuit 36 or may be put into the control unit 27 in order to transmit the check signal to the main microcomputer 33 shown in FIG. 1 via the communication I/F 35b and the communication line 31. In this embodiment, it is assumed that the check output of the ADC timing check circuit 36 is put into the control unit 27.

In addition, the second to fifth voltage monitoring ICs 21-2 to 21-5 basically have the same configuration as the first voltage monitoring IC 21-1. However, the unit cells connected to the cell voltage input section 22 and the power supply circuit 23 are the unit cells BT12 to BT22, BT23 to BT33, BT34 to BT44 and BT45 to BT55 corresponding to the second to fifth voltage monitoring ICs 21-2 to 21-5, respectively.

Upon receiving a command from the communication I/F 35b with the control unit 27 as a destination, the control unit 27 of the first to fifth voltage monitoring ICs 21-1 to 21-5 as configured above performs a control for an operation dictated by the command. In addition, upon receiving a command from the communication I/F 35b with somewhere other than the control unit 27 as a destination, the control unit 27 outputs the command from the communication I/F 35a. Additionally, the control unit 27 outputs data and the like, which are input from the communication I/F 35a, from the communication I/F 35b.

Figure 3:
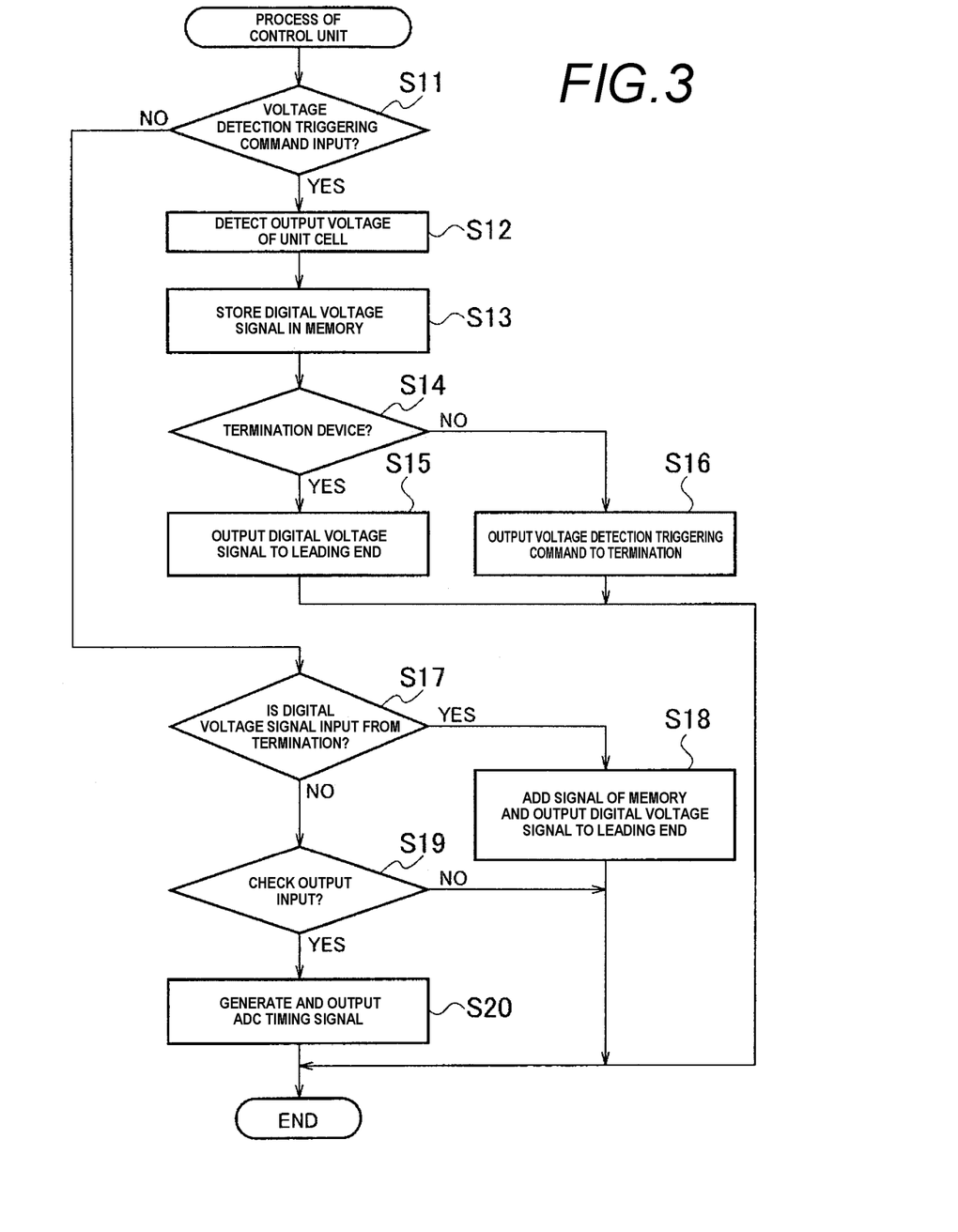
FIG. 3 is a flow chart showing a process performed by a control unit of each voltage monitoring device of FIG. 2.

A main process performed by the control unit 27 of the first to fifth voltage monitoring ICs 21-1 to 21-5, including the above-described control, is as shown in a flow chart of FIG. 3. The process shown in FIG. 3 is repeatedly performed by the control unit 27 of the first to fifth voltage monitoring ICs 21-1 to 21-5.

That is, as shown in FIG. 3, the control unit 27 first checks whether or not a voltage detection triggering command (corresponding to a voltage measurement command) from the main microcomputer 33 (which will be described later) is input from the communication I/F 35b (Step S11). In this embodiment, it is assumed that the voltage detection triggering command includes all of the first to fifth voltage monitoring ICs 21-1 to 21-5 in a receipt destination. If the command is not input (NO in Step S11), the process proceeds to Step S17 which will be described later.

On the other hand, if the voltage detection triggering command from the main microcomputer 33 is input (YES in Step S11), the control unit 27 controls the cell voltage input section 22 to detect an output voltage of each unit cell BT1 to BT11, BT12 to BT22, BT23 to BT33, BT34 to BT44 and BT45 to BT55 of a connection destination in response to the input voltage detection triggering command (Step S12). Then, the output voltage is converted into a voltage signal of each unit cell BT1 to BT11, BT12 to BT22, BT23 to BT33, BT34 to BT44 and BT45 to BT55 in a time series of signals by means of the multiplexer 25, the voltage signal is additionally converted into a digital signal by means of the A/D converter 26, and the digital signal is temporarily stored in the memory 28 (Step S13).

Next, the control unit 27 checks whether or not a self-voltage monitoring IC (the first to fifth voltage monitoring ICs 21-1 to 21-5) is a termination device (the fifth voltage monitoring IC 21-5) on the communication line 31 (Step S14). If the self-voltage monitoring IC is the termination device (i.e., is the fifth voltage monitoring IC 21-5) (YES in Step S14), the digital voltage signal of each unit cell BT45 to BT55 which is temporarily stored in the memory 28 is output from the communication I/F 35b to the communication line 31 toward a voltage monitoring IC (the fourth voltage monitoring IC 21-4) to which a leading end on the communication line 31 is adjacent (Step S15). Thereafter, the process is ended. If the self-voltage monitoring IC is not the termination device (i.e., is one of the first to fourth voltage monitoring ICs 21-1 to 21-4) (NO in Step S14), the input voltage detection triggering command is output from the communication I/F 35a to the communication line 31 toward voltage monitoring ICs (the second to fifth voltage monitoring ICs 21-2 to 21-5) to which a termination on the communication line 31 is adjacent (Step S16). Thereafter, the process is ended.

In Step S17, the control unit 27 checks whether or not a digital voltage signal of each unit cell BT12 to BT22, BT23 to BT33, BT34 to BT44 and BT45 to BT55 from the second to fifth voltage monitoring ICs 21-2 to 21-5 to which the termination on the communication line 31 is adjacent is input from the communication I/F 35b. If the digital voltage signal is not input (NO in Step S17), the process proceeds to Step S19 which will be described later.

On the other hand, if the digital voltage signal of each unit cell BT12 to BT22, BT23 to BT33, BT34 to BT44 and BT45 to BT55 is input from the communication I/F 35b (YES in Step S17), the digital voltage signal of each unit cell BT1 to BT11, BT12 to BT22, BT23 to BT33 and BT34 to BT44, which is temporarily stored in the memory 28, is added to the input digital voltage signal and is output from the communication I/F 35b to the communication line 31 (Step S18). Thereafter, the process is ended.

In Step S19, the control unit 27 checks whether or not a check output from the ADC timing check circuit 36 is input. If the check output is not input (NO in Step S19), the process returns to Step S11. If the check output is input (YES in Step S19), an ADC timing signal is generated and output from the communication I/F 35b to the communication line 31 (Step S20). Thereafter, the process is ended.

In addition, it is assumed that the ADC timing signal generated in Step S20 includes a point of time when the check output from the ADC timing check circuit 36 is input, that is, data to specify a timing when the A/D converter 26 performs the A/D conversion and data to specify the self-voltage monitoring ICs (first to fifth voltage monitoring ICs 21-1 to 21-5). The data to specify the A/D conversion timing of the A/D converter 26 may be, for example, time stamp data of time counted by a clock means controlled by the control unit 27 at the time of inputting the check output.

As shown in FIG. 1, the main microcomputer 33 contains a RAM 33a in which a work area and so on are provided, and a ROM 33b in which a control program and so on are stored. A storage region of latency data is secured in the work area of the RAM 33a. Latency data is stored in the latency data storage region to represent a timing when a charging/discharging current of the secondary battery 13 is measured by a current sensor 37 connected to the main microcomputer 33 in a non-contact manner. In addition, the main microcomputer 33 switches an operation mode between a test mode and a normal mode. The switching of the operation mode may be performed by a setting signal from the outside or by manipulation of an internal dip switch (not shown).

Figure 4:
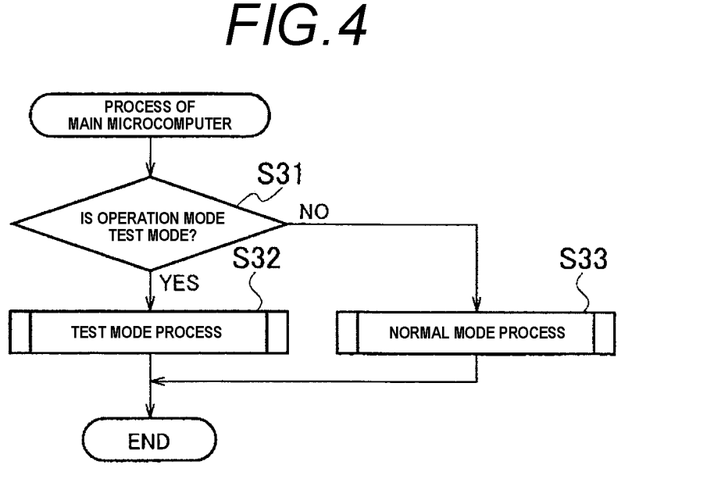
FIG. 4 is a flow chart showing a process performed by a main microcomputer of FIG. 1.

A main process related to state monitoring of the secondary battery 13, which is performed by the main microcomputer 33 executing the control program stored in the ROM 33b, is as shown in a flow chart of FIG. 4. The process shown in FIG. 4 is repeatedly performed by the main microcomputer 33.

That is, as shown in FIG. 4, the main microcomputer 33 checks whether or not an operation mode is a test mode (Step S31). If the operation mode is the test mode (YES in Step S31), a test mode process is performed (Step S32) and the process is ended. If the operation mode is not the test mode (NO in Step S31), a normal mode process is performed (Step S33) and the process is ended.

Figure 5:
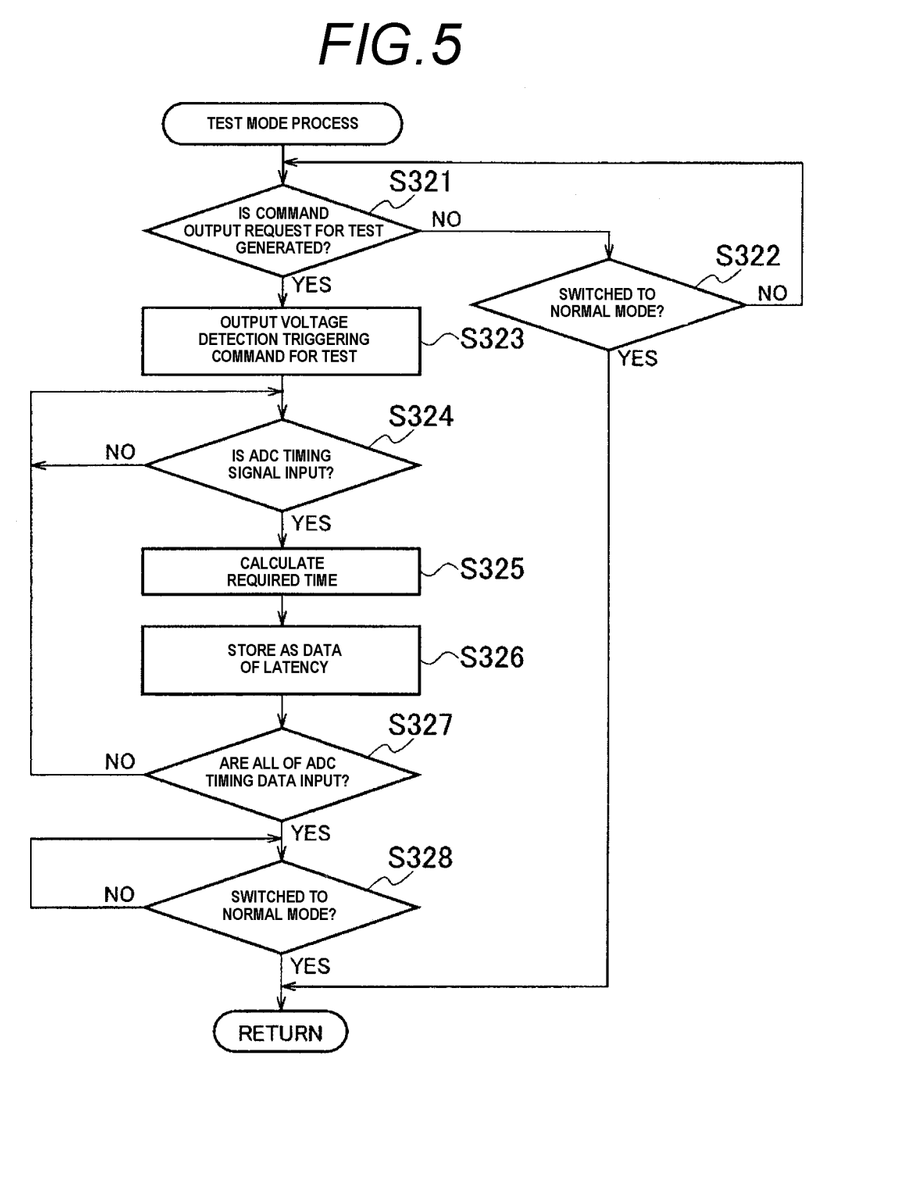
FIG. 5 is a flow chart showing a process performed by the main microcomputer of FIG. 1.

In the test mode process of Step S32, the main microcomputer 33 checks whether or not a request to output a voltage detection triggering command for test purposes is generated (Step S321), as shown in a flow chart of FIG. 5. The request to output the voltage detection triggering command for test purposes may be generated by a setting signal from the outside or may be automatically generated by a switching manipulation to the test mode by means of the above-mentioned internal dip switch (not shown).

If the request to output a voltage detection triggering command for test purposes is not generated (NO in Step S321), the main microcomputer 33 checks whether or not the operation is switched from the test mode to the normal mode (Step S322). If the operation mode is not switched to the normal mode (NO in Step S322), the process returns to Step S321. If the operation mode is switched to the normal mode (YES in Step S322), the test mode process is ended.

If the request to output a voltage detection triggering command for test purposes is generated (YES in Step S321), the voltage detection triggering command for test purposes is output to the communication line 31 (Step S323). Then, it is checked whether or not an ADC timing signal from the communication line 31 is input (Step S324).

If the ADC timing signal is not input (NO in Step S324), Step S324 is repeated. If the ADC timing signal is input (YES in Step S324), the main microcomputer 33 calculates required time from the output of the voltage detection triggering command for test purposes to the communication line 31 in Step S323 to the A/D conversion timing by the A/D converter 26 based on data of the input ADC timing signal (Step S325). The calculated required time is stored, as latency data, in the latency data storage region of the RAM 33*a* in association with the voltage monitoring ICs of an output sources (the first to fifth voltage monitoring ICs 21-1 to 21-5) which is specified by the data of the ADC timing signal input in Step 324 (Step S326).

Next, the main microcomputer 33 checks whether or not all of the ADC timing signals with the first to fifth voltage monitoring ICs 21-1 to 21-5 as output sources are input from the communication line 31 (Step S327). If ADC timing signals from some of the first to fifth voltage monitoring ICs 21-1 to 21-5 are not input (NO in Step S327), the process returns to Step S324. If ADC timing signals are input (YES in Step S327), it is checked whether or not the operation mode is switched from the test mode to the normal mode (Step S328). If the operation mode is not switched to the normal mode (NO in Step S327), Step S327 is repeated. If the operation mode is switched to the normal mode (YES in Step S327), the test mode process is ended.

Figure 6:
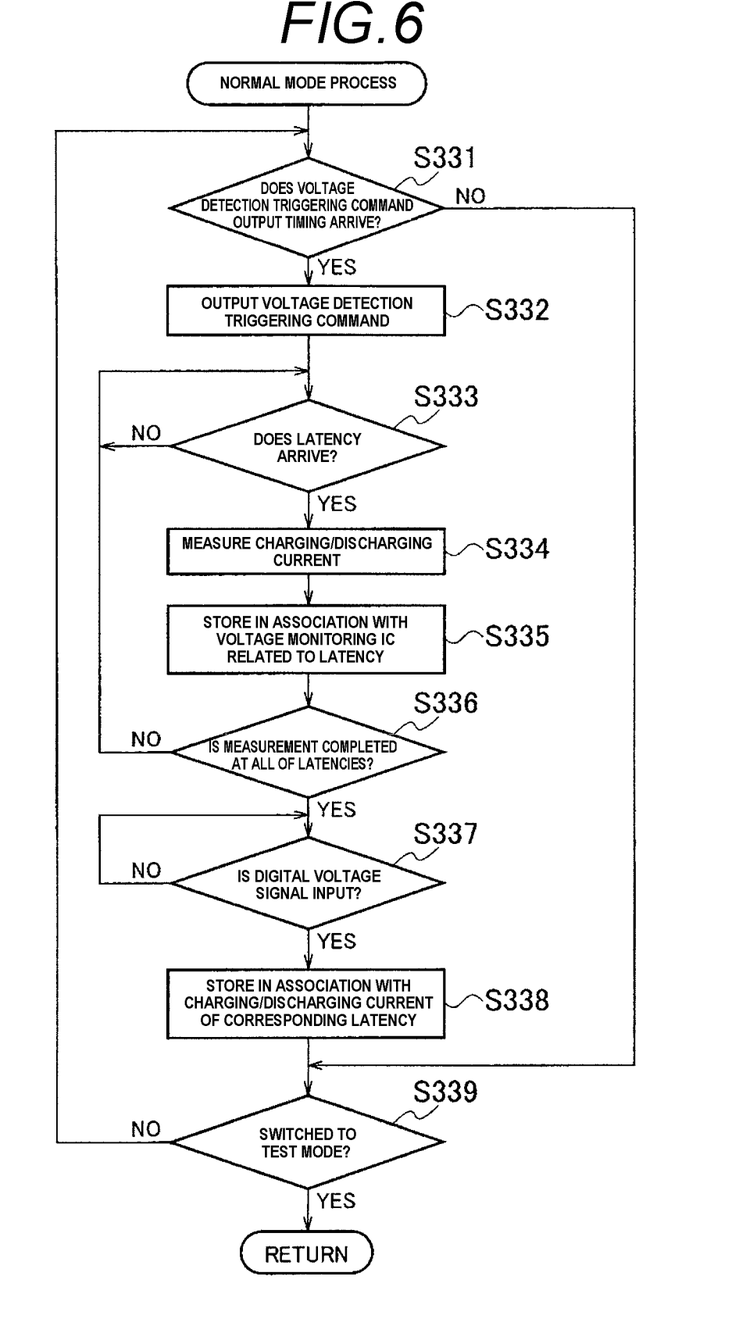
FIG. 6 is a flow chart showing a process performed by the main microcomputer of FIG. 1.

In addition, in the normal mode process of Step S33, the main microcomputer 33 checks whether or not an output timing of the voltage detection triggering command arrives (Step S331), as shown in a flow chart of FIG. 6. It may be assumed that the output timing of the voltage detection triggering command in the normal mode arrives whenever a predetermined period of time elapses or arrives by a command from an ECU unit side (not shown) located on an upper level of the main microcomputer 33.

If the output timing of the voltage detection triggering command does not arrive (NO in Step S331), the process proceeds to Step S339 which will be described later. If the output timing of the voltage detection triggering command arrives (YES in Step S331), the main microcomputer 33 outputs the voltage detection triggering command to the communication line 31 (Step S332). Then, it is checked whether or not one of latencies by the data stored in the latency data storage region of the RAM 33*a* arrives (Step S333).

If the latency does not arrive (NO in Step S333), Step S333 is repeated. If the latency arrives (YES in Step S333), the main microcomputer 33 measures the charging/discharging current of the secondary battery 13 by means of the current sensor 37 (Step S334) and temporarily stores a measurement value of the charging/discharging current in the RAM 33*a* in association with the voltage monitoring ICs (the first to fifth voltage monitoring ICs 21-1 to 21-5) related to the latency arrived in Step S331 (Step S335).

Next, in Step S336, the main microcomputer 33 checks whether or not all of the charging/discharging currents of the secondary battery 13 have been measured in all of the latencies at which the data are stored in the latency data storage region of the RAM 33*a*. If not all of the charging/discharging currents of the secondary battery 13 have been measured in even some of the latencies (NO in Step S336), the process returns to Step S333. If all of the charging/discharging currents of the secondary battery 13 have been measured in all of the latencies (YES in Step S336), it is checked whether or not a digital voltage signal of each unit cell BT1 to BT11, BT12 to BT22, BT23 to BT33, BT34 to BT44 and BT45 to BT55 from the first voltage monitoring IC 21-1 which is closest to the main microcomputer 33 on the communication line 31 is input (Step S337).

If the digital voltage signal is not input (NO in Step S337), Step S337 is repeated. If the digital voltage signal is input (YES in Step S337), the main microcomputer 33 stores a measurement voltage of each unit cell BT1 to BT11, BT12 to BT22, BT23 to BT33, BT34 to BT44 and BT45 to BT55, which is indicated by the input digital voltage signal, in the RAM 33*a* in association with the charging/discharging current of the RAM 33*a* associated with the first to fifth voltage monitoring ICs 21-1 to 21-5 (Step S338). Then, the process proceeds to Step S339.

That is, the measurement voltage of the unit cells BT1 to BT11 is stored in the RAM 33*a* in association with the charging/discharging current related to the first voltage monitoring IC 21-1 (latency) corresponding to the unit cells BT1 to BT11. Hereinafter, similarly, the measurement voltages of the unit cells BT12 to BT22, BT23 to BT33, BT34 to BT44 and BT45 to BT55 are stored in the RAM 33*a* in association with the charging/discharging current related to the corresponding second to fifth voltage monitoring ICs 21-2 to 21-5 (each latency).

In addition, a set of the measurement voltages of the unit cells BT1 to BT11, BT12 to BT22, BT23 to BT33, BT34 to BT44 and BT45 to BT55 stored in the RAM 33*a* and the charging/discharging current of the RAM 33*a* related to the first to fifth voltage monitoring ICs 21-1 to 21-5 (each latency) may be output as is to the ECU unit side (not shown) located on an upper level of the main microcomputer 33. Alternatively, resistance values of the unit cells BT1 to BT11, BT12 to BT22, BT23 to BT33, BT34 to BT44 and BT45 to BT55 may be calculated and output to the ECU unit side (not shown).

In step S339, it is checked whether or not the operation mode is switched from the normal mode to the test mode. If the operation is not switched to the test mode (NO in Step S339), the process returns to Step S331. If the operation is switched to the test mode (YES in Step S339), the normal mode process is ended.

In the state monitoring unit 10 of this embodiment as configured above, the voltage detection triggering command output by the main microcomputer 33 is first received by the first voltage monitoring IC 21-1 located on the leading end of the communication line 31, thereafter received by the second, third and fourth voltage monitoring ICs 21-2, 21-3 and 21-4 in order, and finally received by the fifth voltage monitoring IC 21-5 located on the termination of the communication line 31.

Accordingly, in response to the receipt of the voltage detection triggering command, timings of measurement of voltages of the unit cells BT1 to BT11, BT12 to BT22, BT23 to BT33, BT34 to BT44 and BT45 to BT55 to which the voltage monitoring ICs 21-1 to 21-5 correspond respectively generate the same time difference as a timing of receipt of the voltage detection triggering command.

Therefore, in the state monitoring unit 10 of this embodiment, required time from the point of time when the main microcomputer 33 outputs the voltage detection triggering command to the point of time when the voltages of the unit cells BT1 to BT11, BT12 to BT22, BT23 to BT33, BT34 to BT44 and BT45 to BT55 to which the voltage monitoring ICs 21-1 to 21-5 correspond respectively are measured is stored in advance as latency in the RAM 33*a* of the main microcomputer 33. The latency (the required time) may be acquired by setting the ADC timing check circuit 36 of each voltage monitoring IC 21-1 to 21-5 to be monitoring mode ON and operating the main microcomputer 33 in the test mode.

That is, in response to the voltage detection triggering command for test purposes output by the main microcomputer 33 of the test mode, the cell voltage input section 22 of each voltage monitoring IC 21-1 to 21-5 detects the voltages of the unit cells BT1 to BT11, BT12 to BT22, BT23 to BT33, BT34 to BT44 and BT45 to BT55. Then, the A/D converter 26 performs an A/D conversion for the detected voltages. When the A/D converter 26 performs the A/D conversion for the detected voltages, a signal level of the check output of the ADC timing check circuit 36 is inverted at this timing. Therefore, the latency (the required time) to be stored in the RAM 33a can be acquired by the main microcomputer 33 calculating a time difference between an inversion timing of the check output of the ADC timing check circuit 36 and an output timing of the voltage detection triggering command for test purposes by the main microcomputer 33.

After the latency is stored in the RAM 33a of the main microcomputer 33, the main microcomputer 33 of the normal mode outputs the voltage detection triggering command to the communication line 31 as necessary. Each voltage monitoring IC 21-1 to 21-5 which has received the voltage detection triggering command measures the voltages of the unit cells BT1 to BT11, BT12 to BT22, BT23 to BT33, BT34 to BT44 and BT45 to BT55. The main microcomputer 33 stores a timing when the A/D converter 26 performs the A/D conversion for the measured voltage in the RAM 33a as the latency (the required time).

Therefore, the main microcomputer 33 measures the charging/discharging current of the secondary battery 13 by means of the current sensor 37 when the latency stored in the RAM 33a arrives after the voltage detection triggering command is output to the communication line 31. Accordingly, the charging/discharging current of the secondary battery 13 can be measured in synchronization with timings when each voltage monitoring IC 21-1 to 21-5 which received the voltage detection triggering command measures the voltages of the unit cells BT1 to BT11, BT12 to BT22, BT23 to BT33, BT34 to BT44 and BT45 to BT55.

The voltage of each unit cell BT1 to BT11, BT12 to BT22, BT23 to BT33, BT34 to BT44 and BT45 to BT55 and the charging/discharging current of the secondary battery 13, which are measured at the same timing, are stored in the RAM 33a of the associated main microcomputer 33. Accordingly, for example, the ECU unit (not shown) located on the upper level of the main microcomputer 33 is allowed to precisely determine the state of the secondary battery 13 using the voltage of each unit cell BT1 to BT11, BT12 to BT22, BT23 to BT33, BT34 to BT44 and BT45 to BT55 and the charging/discharging current of the secondary battery 13, which are measured at the same timing, or a resistance value of each unit cell BT1 to BT11, BT12 to BT22, BT23 to BT33, BT34 to BT44 and BT45 to BT55, which is obtained from the voltage and the charging/discharging current.

In addition, the required time, which is stored as latency in the RAM 33a of the main microcomputer 33, may not be the required time from the point of time when the main microcomputer 33 outputs the voltage detection triggering command to the point of time when the voltages of the unit cells BT1 to BT11, BT12 to BT22, BT23 to BT33, BT34 to BT44 and BT45 to BT55 to which the voltage monitoring ICs 21-1 to 21-5 correspond respectively are measured, as in the above-described embodiment.

For example, if the maximum time difference between a timing of voltage measurement and a timing of charging/discharging current measurement, which is allowed after the ECU unit (not shown) located on the upper level of the main microcomputer 33 is allowed to precisely determine the state of the secondary battery 13, is ±A μsec, and if the maximum time difference between the shortest required time and the longest required time is within 2A μsec, the required time, which is stored as the latency in the RAM 33a of the main microcomputer 33, may be set to an average of required times or an intermediate value closest to the average. At this time, a time difference between the intermediate value or the average and the shortest and longest times required is more preferably A μsec.

If the latency is set to an intermediate value of required time, the test mode process and the normal mode process performed by the main microcomputer 33 are somewhat changed from the contents shown in the flow charts of FIGS. 5 and 6.

Figure 7:
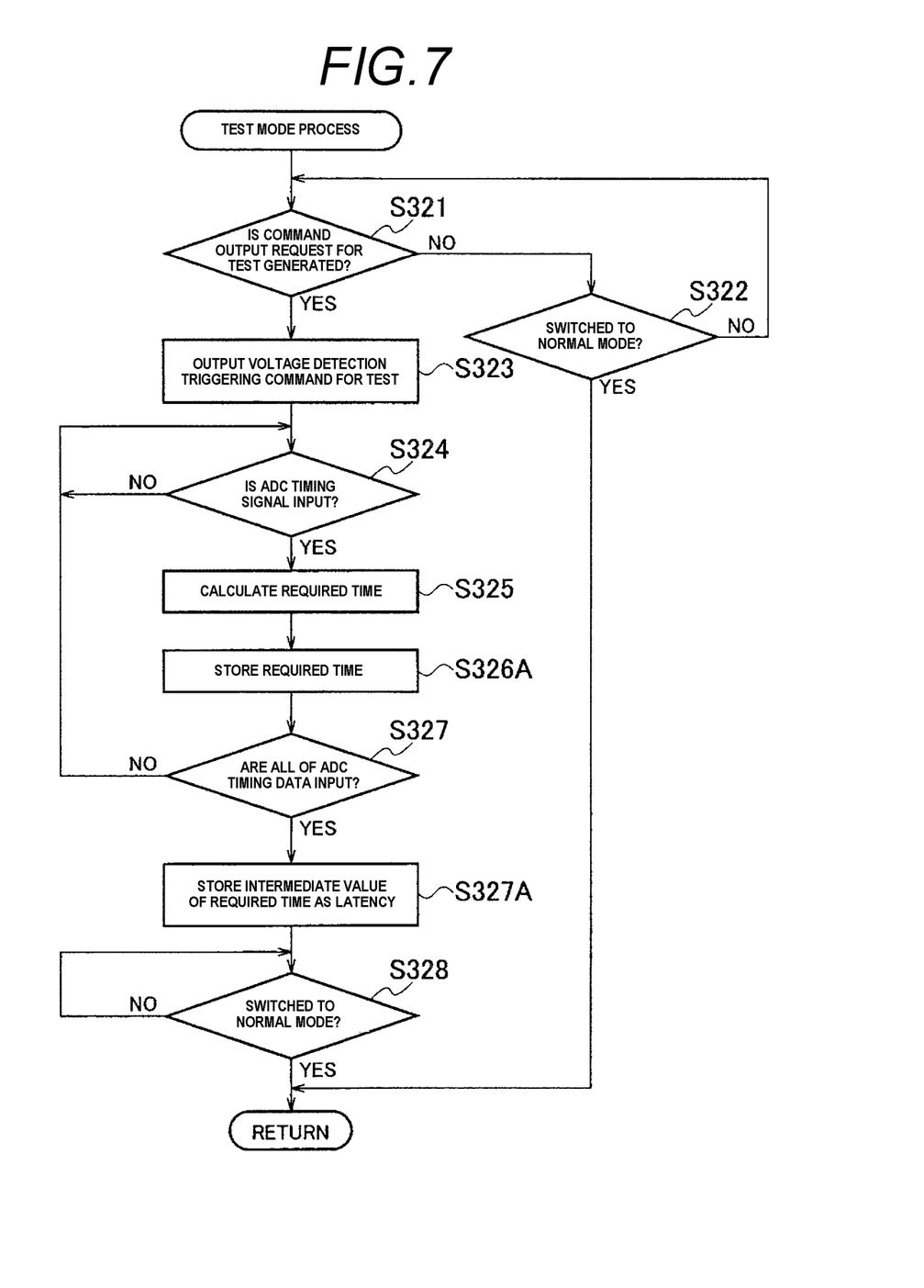
FIG. 7 is a flow chart showing a process performed by a main microcomputer of a state monitoring unit for an assembled battery according to another embodiment of the present invention.

First, for the test mode process, in Step S326A instead of Step S326 of FIG. 5, the required time, which is calculated in Step S325, is temporarily stored in the RAM 33a, as shown in a flow chart of FIG. 7. Then, if all of the ADC timing signals with the first to fifth voltage monitoring ICs 21-1 to 21-5 as output sources are input from the communication line 31 in Step S327 of FIG. 5 (YES), an intermediate value of times required, which are temporarily stored in the RAM 33a, is stored as latency data in the latency data storage region of the RAM 33a, in Step S327A, as shown in FIG. 7. Then, the process proceeds to Step S328. Other contents are the same as those shown in FIG. 5.

Figure 8:
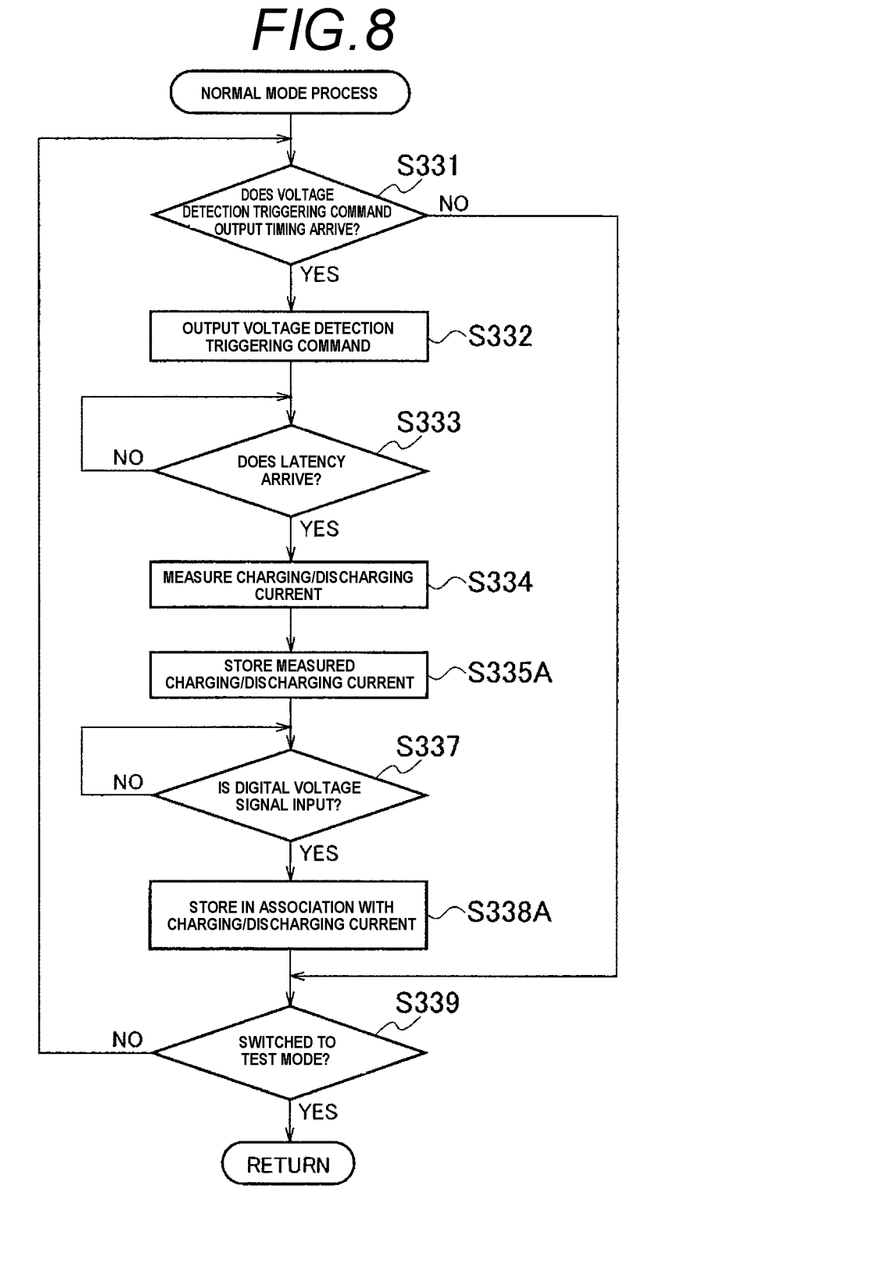
FIG. 8 is a flow chart showing a process performed by a main microcomputer of a state monitoring unit for an assembled battery according to still another embodiment of the present invention.

Next, for the normal mode process, in Step S335A in stead of Step S335 of FIG. 6, a measurement value of the charging/discharging current is temporarily stored in the RAM 33a, as shown in a flow chart of FIG. 8. Thereafter, with Step S336 of FIG. 6 omitted, the process proceeds to Step S337, as shown in FIG. 8. Then, if a digital voltage signal of each unit cell BT1 to BT11, BT12 to BT22, BT23 to BT33, BT34 to BT44 and BT45 to BT55 from the first voltage monitoring IC 21-1 which is closest to the main microcomputer 33 on the communication line 31 is input in Step S337 (YES), a measurement voltage of each unit cell BT1 to BT11, BT12 to BT22, BT23 to BT33, BT34 to BT44 and BT45 to BT55, which is indicated by the input digital voltage signal, is stored in the RAM 33a in association with the charging/discharging current of the RAM 33a in Step S338A instead of Step S338 of FIG. 6, as shown in FIG. 8. Then, the process proceeds to Step S339. Other contents are the same as those shown in FIG. 6.

Even in such a configuration, for example, the ECU unit (not shown) located on the upper level of the main microcomputer 33 is allowed to precisely determine the state of the secondary battery 13 using the voltage of each unit cell BT1 to BT11, BT12 to BT22, BT23 to BT33, BT34 to BT44 and BT45 to BT55 and the charging/discharging current of the secondary battery 13 or a resistance value of each unit cell BT1 to BT11, BT12 to BT22, BT23 to BT33, BT34 to BT44 and BT45 to BT55, which is obtained from the voltage and the charging/discharging current.

In addition, the above-described embodiment was configured such that, when the digital voltage signal of each unit cell BT12 to BT22, BT23 to BT33, BT34 to BT44 and BT45 to BT55 is input from the second to fifth voltage monitoring ICs 21-2 to 21-5 to which the termination on the communication line 31 is adjacent, the control unit 27 of the first to fourth voltage monitoring ICs 21-1 to 21-4 adds the digital voltage signal of each unit cell BT1 to BT11, BT12 to BT22, BT23 to BT33 and BT34 to BT44, which is measured in the control unit 27, to the input digital voltage signal and outputs a resultant signal to the first to fourth voltage monitoring ICs 21-1 to 21-4 to which the leading end on the communication line 31 is adjacent.

However, when each of the first to fifth voltage monitoring ICs 21-1 to 21-5 measures the voltage of each unit cell BT1 to BT11, BT12 to BT22, BT23 to BT33, BT34 to BT44 and BT45 to BT55 in response to the input of the voltage detection triggering command, a digital voltage signal indicating the measured voltage may be individually output to the main microcomputer 33 via the different first to fourth voltage monitoring ICs 21-1 to 21-4 which are located in the leading end on the communication line 31.

The present invention is very useful when a cell voltage and a charging/discharging current of an assembled battery constituting a high voltage battery are separately measured in a high voltage side and a low voltage side.

What is claimed is:

1. A state monitoring unit for monitoring a state of an assembled battery in which a plurality of unit cells are connected in series, the state monitoring unit comprising:
    a high voltage side including a plurality of voltage monitoring devices, each device corresponding to respective unit cells among the plurality of unit cells; and
    a low voltage side electrically isolated with the high voltage side, and including a controller which controls the respective voltage monitoring devices, wherein
    a common voltage measurement command for instructing a voltage measurement of the unit cells is transmitted from the controller to the respective voltage monitoring devices connected via a communication channel in a daisy-chain scheme,
    the controller comprises a storage for storing latency time determined based on a required time for each of the voltage monitoring devices elapsing from transmission of the common voltage measurement command with respect to the communication channel to voltage measurement of the unit cells performed by the each of the voltage monitoring devices which has received the common voltage measurement command, and
    the controller measures charging/discharging current of the assembled battery when the latency time has elapsed from the transmission of the common voltage measurement command with respect to the communication channel.

2. The state monitoring unit according to claim 1, wherein each of the voltage monitoring devices includes therein a measurement timing detection circuit, output of which is changed when performing the voltage measurement of the corresponding unit cells, and
    the required time is a time elapsing from the transmission of the common voltage measurement command with respect to the communication channel by the controller to change in output of the measurement timing detection circuit.

3. The state monitoring unit according to claim 1, wherein the maximum time difference of the required times for the voltage monitoring devices falls within the maximum time difference allowed between a timing of the voltage measurement and a timing of the charging/discharging current measurement, and
    the latency time is set to an average value of the required times for the voltage monitoring devices or an intermediate value closest to the average value.

4. The state monitoring unit according to claim 1, wherein the required time for each of the voltage monitoring devices is stored in the storage as the latency time, and
    the controller measures respective charging/discharging currents of the assembled battery when the required time for each of the voltage monitoring devices as the latency time has elapsed from the transmission of the common voltage measurement command with respect to the communication channel.

* * * * *